United States Patent
Hung et al.

(10) Patent No.: US 10,208,908 B2
(45) Date of Patent: Feb. 19, 2019

(54) LIGHT SOURCE, MANUFACTURING METHOD THEREOF, CUSTOMIZABLE ILLUMINATION DEVICE AND MANUFACTURING METHOD THEREOF

(71) Applicant: BOE TECHNOLOGY GROUP CO., LTD., Beijing (CN)

(72) Inventors: Hsiaowen Hung, Beijing (CN); Haochih Hung, Beijing (CN); Shoulei Shi, Beijing (CN); Yingying Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/122,276

(22) PCT Filed: Aug. 20, 2015

(86) PCT No.: PCT/CN2015/087593
§ 371 (c)(1),
(2) Date: Aug. 29, 2016

(87) PCT Pub. No.: WO2016/155208
PCT Pub. Date: Oct. 6, 2016

(65) Prior Publication Data
US 2017/0067607 A1    Mar. 9, 2017

(30) Foreign Application Priority Data
Mar. 30, 2015   (CN) .......................... 2015 1 0146117

(51) Int. Cl.
*F21S 9/03*    (2006.01)
*F21V 23/06*   (2006.01)
(Continued)

(52) U.S. Cl.
CPC ............... *F21S 9/03* (2013.01); *F21V 23/06* (2013.01); *H01L 27/3202* (2013.01);
(Continued)

(58) Field of Classification Search
USPC ....................................................... 362/183
See application file for complete search history.

(56) References Cited

U.S. PATENT DOCUMENTS

2004/0253759 A1    12/2004   Garber et al.
2008/0135951 A1*    6/2008   Kaushik ............ H01L 21/28194
                                                                257/410
(Continued)

FOREIGN PATENT DOCUMENTS

CN    101739909 A    6/2010
CN    103474586 A    12/2013
(Continued)

OTHER PUBLICATIONS

International Search Report dated Oct. 22, 2015 issued in corresponding International Application No. PCT/CN2015/087593 along with an English translation of the Written Opinion of the International Searching Authority.
(Continued)

*Primary Examiner* — Matthew Mikels
(74) *Attorney, Agent, or Firm* — Nath, Goldberg & Meyer; Joshua B. Goldberg

(57) ABSTRACT

A light source includes a light-source unit including a plurality of light emitting units and a power supply unit provided at a non-light emitting side of the light-source unit. The plurality of light emitting units are connected in parallel and include common connection electrodes. The common connection electrodes are electrically connected to electrode terminals of the power supply unit, respectively.

16 Claims, 8 Drawing Sheets

(51) Int. Cl.
    *H01L 51/00*           (2006.01)
    *H01L 27/32*           (2006.01)
    *H01L 51/52*           (2006.01)
    *H05B 33/08*          (2006.01)
    *F21Y 115/15*         (2016.01)

(52) U.S. Cl.
    CPC ...... *H01L 27/3227* (2013.01); *H01L 51/0081* (2013.01); *H01L 51/5203* (2013.01); *H01L 51/5275* (2013.01); *H05B 33/0803* (2013.01); *H05B 33/0896* (2013.01); *F21Y 2115/15* (2016.08); *H01L 2251/5361* (2013.01)

(56) References Cited

U.S. PATENT DOCUMENTS

| | | | |
|---|---|---|---|
| 2010/0237374 A1 | 9/2010 | Chu et al. | |
| 2011/0068700 A1* | 3/2011 | Fan | H05B 33/0818 315/185 R |
| 2013/0044095 A1* | 2/2013 | Heo | H01L 27/3276 345/211 |
| 2014/0240304 A1 | 8/2014 | In et al. | |

FOREIGN PATENT DOCUMENTS

| | | |
|---|---|---|
| CN | 203363944 U | 12/2013 |
| CN | 103681731 A | 3/2014 |
| CN | 103945588 A | 7/2014 |
| CN | 104124399 A | 10/2014 |
| CN | 104183588 A | 12/2014 |
| CN | 104332561 A | 2/2015 |
| CN | 104362260 A | 2/2015 |
| CN | 104748053 A | 7/2015 |
| CN | 204460062 U | 7/2015 |
| JP | 2012181396 A | 9/2012 |
| TW | 200730004 A | 8/2007 |
| WO | 2010/056288 A1 | 5/2010 |

OTHER PUBLICATIONS

Office Action dated Aug. 26, 2016 issued in corresponding Chinese Application No. 201510146117.5.

\* cited by examiner

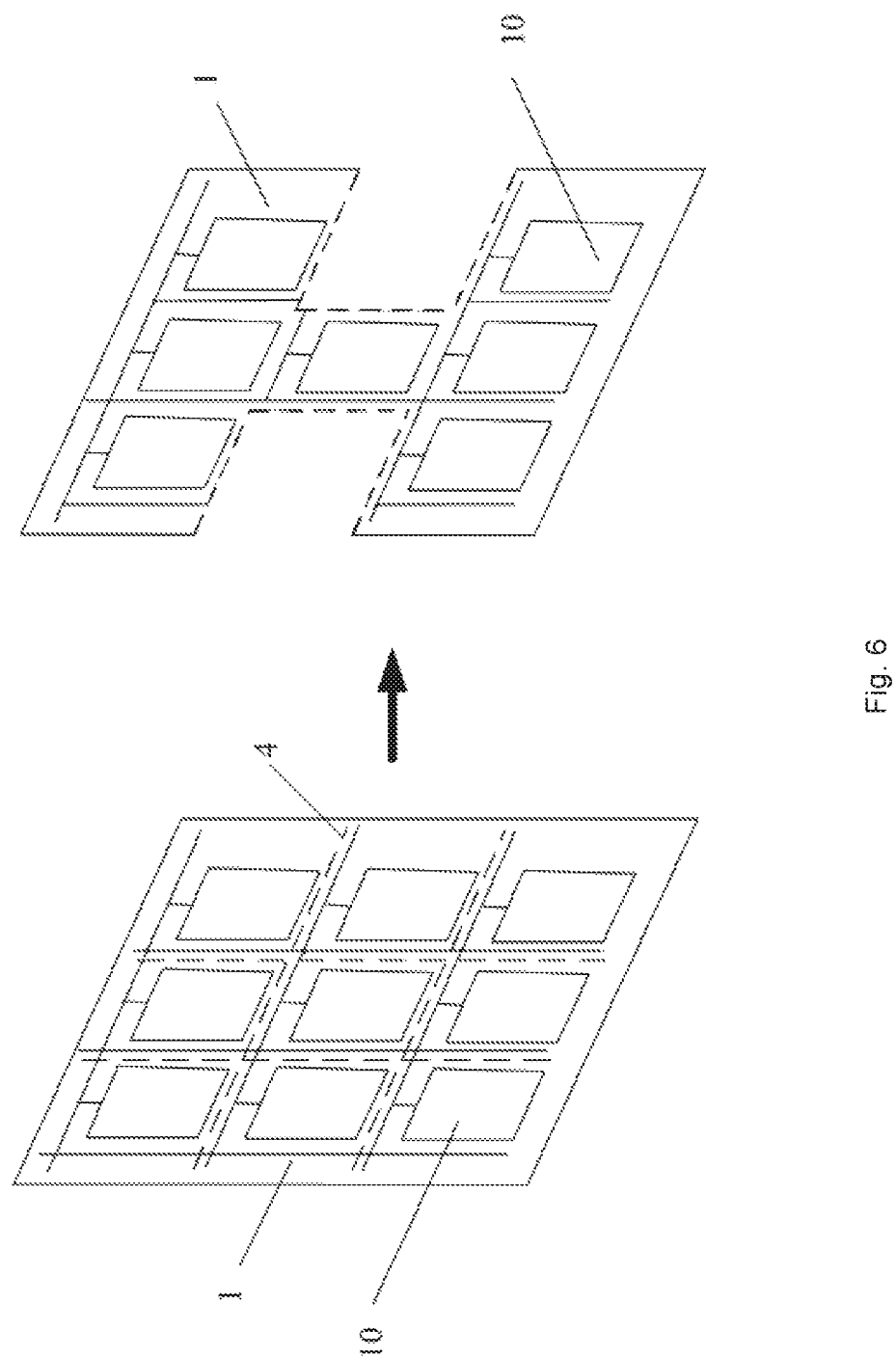

LIGHT SOURCE, MANUFACTURING METHOD THEREOF, CUSTOMIZABLE ILLUMINATION DEVICE AND MANUFACTURING METHOD THEREOF

This is a National Phase Application filed under 35 U.S.C. 371 as a national stage of PCT/CN2015/087593, filed Aug. 20, 2015, an application claiming the benefit of Chinese Application No. 201510146117.5, filed Mar. 30, 2015, the content of each of which is hereby incorporated by reference in its entirety.

TECHNICAL FIELD

The present invention relates to the field of lighting technology, and in particular, relates to a light source, a manufacturing method thereof, a customizable illumination device and a manufacturing method thereof.

BACKGROUND

An organic light-emitting diode (OLED) has been widely used due to its advantages of self-luminescence, good visibility, high brightness, small thickness, and the like, and especially due to its advantage of being formed as various shapes by including a flexible substrate. As a flat light source, an OLED has unmatched advantages over a traditional LED in structure, quality of light source, feature of product, and the like. If a LED represents a direction of future development, then an OLED would be a popular technology in the future.

Currently, human being is facing grand challenges to achieve sustainable economic and social developments. It has been a global hot issue to make economic development under dual constraints of limited resources and strict environmental requirements, and an energy issue would be more prominent. Meanwhile, the self-luminescence of an OLED which serves as an electronic device requires a power supply. However, all existing OLED devices employ fixed power supply. Thus, once a light source is manufactured by using an existing OLED device, the light source has a fixed shape and a fixed performance, and is difficult to be customized. Further, there is no an OLED device powered by solar energy in the prior art.

SUMMARY

In view of the above disadvantages in the prior art, the present invention provides a light source, a manufacturing method thereof, a customizable illumination device and a manufacturing method thereof. The light source can be cut into any shape as desired, and has improved customization flexibility. Further, the light source is conceived by combining a solar photovoltaic technology and an OLED lighting technology together so that a solar device and an OLED device can be integrated to form an integrated renewable compound device.

A technical solution employed to solve the above technical problems is a light source, which includes a light-source unit including a plurality of light emitting units and a power supply unit provided at a non-light emitting side of the light-source unit, wherein, the plurality of light emitting units are connected in parallel and include common connection electrodes, and the common connection electrodes are electrically connected to electrode terminals of the power supply unit, respectively.

Preferably, each of the light emitting units includes a first electrode and a second electrode which are provided opposite to each other and in different layers and a light emitting layer and an insulating layer which are provided between the first electrode and the second electrode, the common connection electrodes include a positive common connection electrode provided in a layer in which the first electrode is provided and a negative common connection electrode provided in a layer in which the second electrode is provided, a plurality of the first electrodes are connected to a positive electrode terminal of the power supply unit through the positive common connection electrode, and a plurality of the second electrodes are connected to a negative electrode terminal of the power supply unit through the negative common connection electrode.

Preferably, the plurality of the first electrodes are connected in parallel to form the positive common connection electrode, and the plurality of the second electrodes are connected in parallel to form the negative common connection electrode.

Preferably, each of the first electrodes includes a first-electrode body and a first-electrode connection portion and a first-electrode connector which are formed by an extension of the first-electrode body;

each of the second electrodes includes a second-electrode body and a second-electrode connection portion and a second-electrode connector which are formed by an extension of the second-electrode body, the second-electrode body, the second-electrode connection portion and the second-electrode connector correspond to the first-electrode body, the first-electrode connection portion and the first-electrode connector, respectively;

the first-electrode connectors of the plurality of light emitting units are electrically connected to each other to form the positive common connection electrode, and the second-electrode connectors of the plurality of light emitting units are electrically connected to each other to form the negative common connection electrode; and the insulating layer is provided in a peripheral region between the first-electrode body and the second-electrode body, and the light emitting layer is provided in a closed region defined by the insulating layer.

Preferably, the plurality of light emitting units are arranged in an array, each of the positive common connection electrode and the negative common connection electrode includes a first common connection electrode and a second common connection electrode, the first common connection electrode is formed by electrically connecting to each other the first-electrode connectors of the light emitting units in a row direction and extends along the row direction, the second common connection electrode crosses and is electrically connected to the first common connection electrode, and extends along a column direction, the light emitting units in each column correspond to one second common connection electrode.

Preferably, the first-electrode body and the second-electrode body have a same shape, the first-electrode connection portion and the second-electrode connection portion have a same shape, and the first-electrode connector and the second-electrode connector have a same shape.

Preferably, a shape of the first-electrode body is a polygon or a circle.

Preferably, the light emitting layer is made of Alq or Balq, and the insulating layer is made of silicon dioxide or a photoresist.

Preferably, the power supply unit includes a power conversion section and a power storage section, and the power conversion section has a shape adapted to that of the light-source unit.

Preferably, the power conversion section is a solar panel, the power storage section is a rechargeable battery, and the rechargeable battery is provided between the light-source unit and the solar panel or at a side of the light-source unit and the solar panel.

Preferably, a plurality of microstructures are provided at a light emitting side of the light-source unit, and/or, a plurality of microstructures are provided at an outer surface of the power supply unit which is not in direct contact with the light-source unit.

Preferably, a shape of each of the plurality of microstructures is any one of a triangular strip, a microsphere, a tetrahedron and a cone, and an arrangement of the plurality of microstructures is a corresponding one of a triangular-strip array, a microsphere array, a tetrahedron array and a cone array.

Preferably, the light-source unit and the power supply unit are assembled together by being attached to each other.

There is provided a customizable illumination device, which includes the light source as described above.

There is provided a manufacturing method of a light source, including steps of:

forming a light-source unit, so that the light-source unit includes a plurality of light emitting units which are connected in parallel;

forming a power supply unit, so that the power supply unit includes a power conversion section and a power storage section; and assembling the light-source unit and the power supply unit together by attaching them to each other, and electrically connecting the light-source unit to electrode terminals of the power supply unit through common connection electrodes.

Preferably, the step of forming the light-source unit includes steps of:

forming a pattern including a first electrode on a substrate;

forming, on the first electrode, a pattern including an insulating layer and a pattern of a light emitting region defined by the pattern of the insulating layer;

forming a light emitting layer in the pattern of the defined light emitting region;

forming a pattern including a second electrode on the light emitting layer and the insulating layer; and packaging the above structures to form the light-source unit.

Preferably, the first electrode includes a first-electrode body and a first-electrode connection portion and a first-electrode connector which are formed by an extension of the first-electrode body;

the pattern of the insulating layer is formed in a peripheral region of the first-electrode body;

the pattern of the light emitting layer is formed in a closed region defined by the insulating layer;

the second electrode includes a second-electrode body and a second-electrode connection portion and a second-electrode connector which are formed by an extension of the second-electrode body, the second-electrode body, the second-electrode connection portion and the second-electrode connector correspond to the first-electrode body, the first-electrode connection portion and the first-electrode connector, respectively;

wherein, the common connection electrodes include a positive common connection electrode provided in a layer in which the first electrode is provided and a negative common connection electrode provided in a layer in which the second electrode is provided, a plurality of the first electrodes are connected to a positive electrode terminal of the power supply unit through the positive common connection electrode, and a plurality of the second electrodes are connected to a negative electrode terminal of the power supply unit through the negative common connection electrode; and wherein, the first-electrode connectors of the plurality of light emitting units are electrically connected to each other to form the positive common connection electrode, and the second-electrode connectors of the plurality of light emitting units are electrically connected to each other to form the negative common connection electrode.

Preferably, the plurality of light emitting units are arranged in an array, each of the positive common connection electrode and the negative common connection electrode includes a first common connection electrode and a second common connection electrode, the first common connection electrode is formed by electrically connecting to each other the first-electrode connectors of the light emitting units in a row direction and extends along the row direction, the second common connection electrode crosses and is electrically connected to the first common connection electrode, and extends along a column direction, the light emitting units in each column correspond to one second common connection electrode.

There is provided a manufacturing method of a customizable illumination device, including: employing the light source as described above, and cutting the light source along a same side of the common connection electrodes relative to at least one of the light emitting units, so that all of the light emitting units included in a resultant light-source portion are connected to each other through the common connection electrode to form a predetermined-shape light-source portion of the customizable illumination device.

The advantageous effects of the present invention are as follows. The light source is cuttable with ease while maintaining a normal light-emitting function, by connecting a plurality of light emitting units in parallel and connecting the common connection electrodes therein to each other as a grid, thereby facilitating formation of a customizable illumination device. Further, the light source is conceived by combining a solar photovoltaic technology and an OLED lighting technology together so that a solar device and an OLED device can be integrated to form an integrated renewable compound device.

BRIEF DESCRIPTION OF THE DRAWINGS

FIG. 6 is a schematic diagram showing a light-source portion of a customizable illumination device obtained by cutting the light source of FIG. 1A.

REFERENCE NUMERALS

1: light-source unit; 10: light emitting unit; 11: first electrode; 111: first-electrode body; 112: first-electrode connection portion; 113: first-electrode connector; 114: common connection electrode; 12: second electrode; 121: second-electrode body; 122: second-electrode connection portion; 123: second-electrode connector; 13: insulating layer; 14: light emitting layer; 2: power supply unit; 21: power conversion section; 22: power storage section; 3: microstructure; 4: cutting line.

DETAILED DESCRIPTION

In order to make those skilled in the art understand the technical solutions of the present invention better, a light source, a manufacturing method thereof; a customizable illumination device and a manufacturing method thereof provided by the present invention will be further described below in detail with reference to the accompanying drawings and specific embodiments.

First Embodiment

The present embodiment provides a cuttable light source, which can be cut into any shape as desired, thereby improving the customization flexibility of a light source.

Figure 1A:
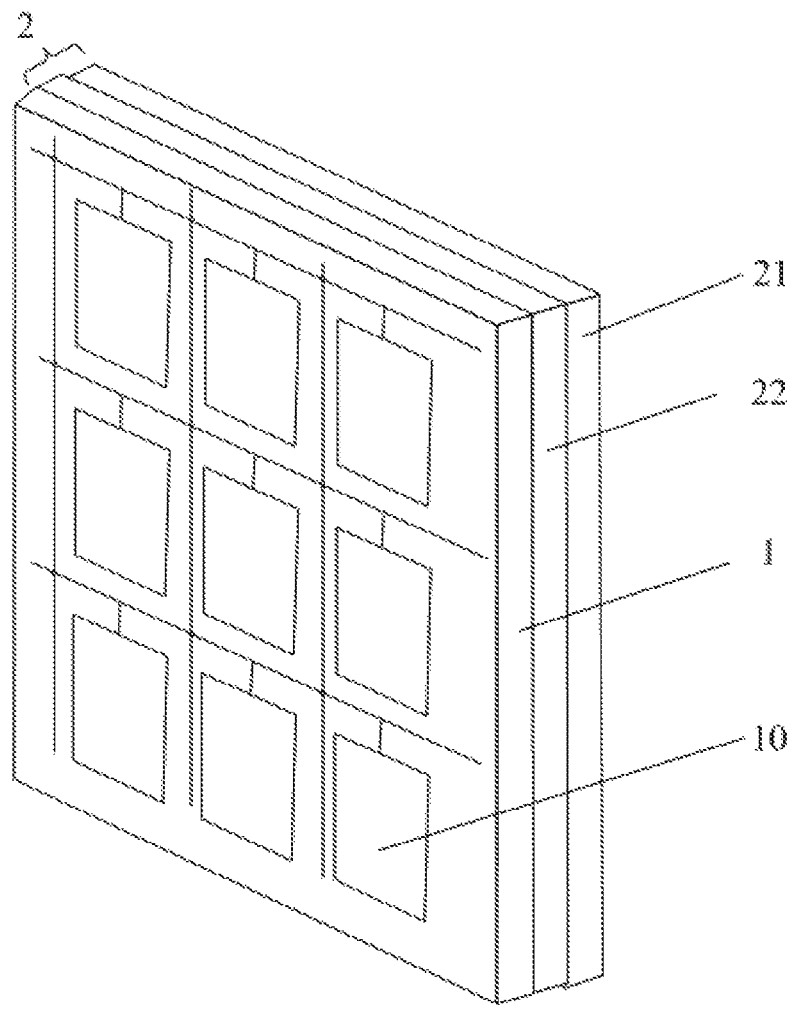
FIG. 1A is a schematic diagram showing an exemplary structure of a light source according to a first embodiment of the present invention.
Figure 1B:
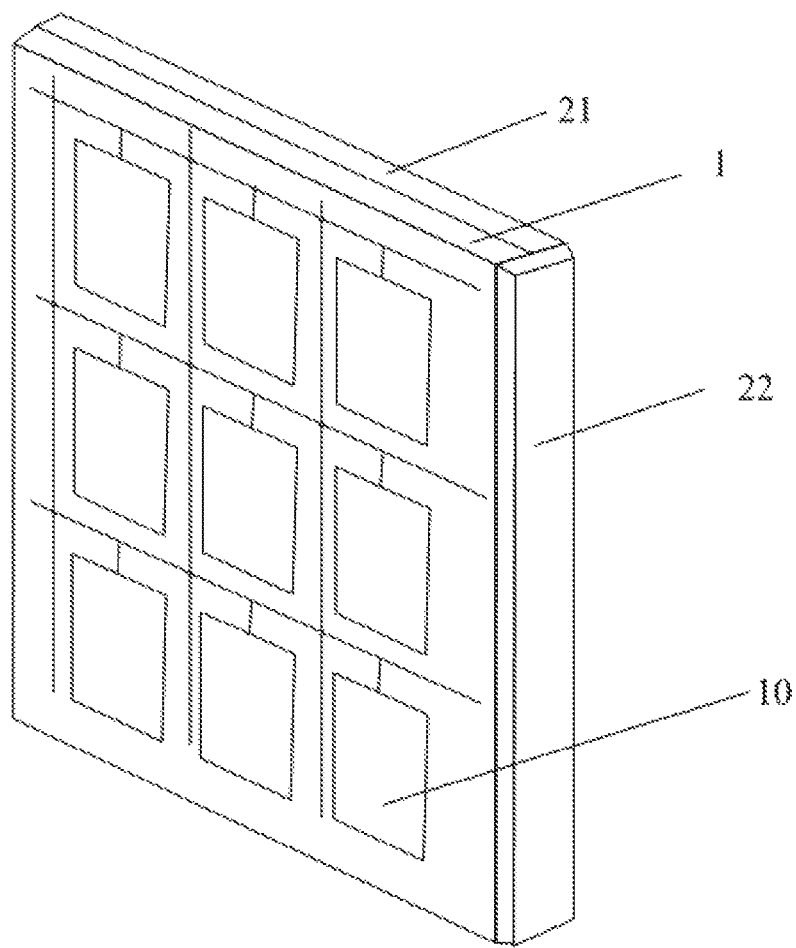
FIG. 1B is a schematic diagram showing another exemplary structure of the light source according to the first embodiment of the present invention.
Figure 2A:
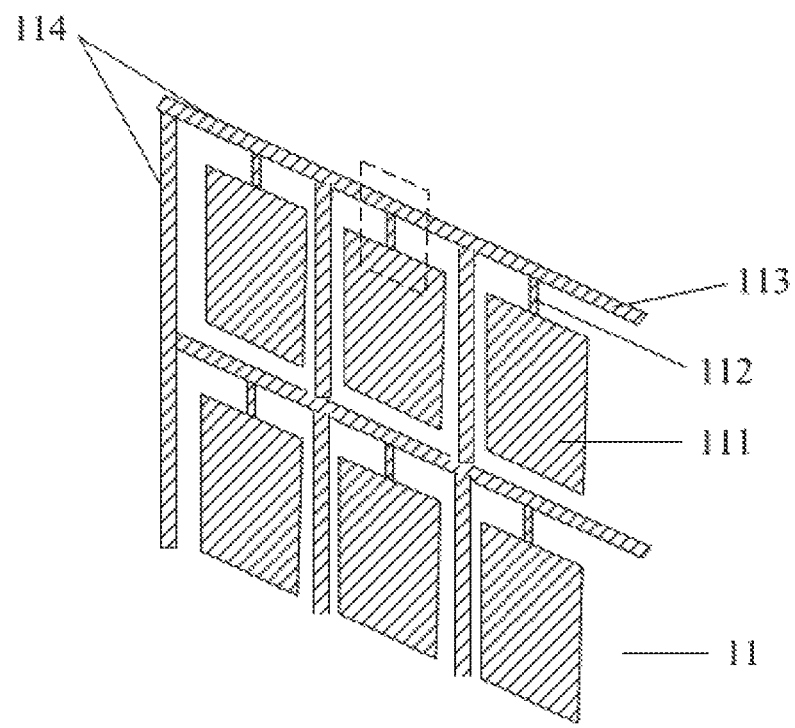
FIG. 2A is a schematic diagram showing a structure of a first electrode and connection among a plurality of light emitting units according to the first embodiment of the present invention.

As shown in FIGS. 1A and 1B, the light source includes a light-source unit 1 including a plurality of light emitting units 10 and a power supply unit 2 provided at a non-light emitting side of the light-source unit 1. Referring to FIGS. 1A, 1B and 2A, the plurality of light emitting units 10 are connected in parallel and include common connection electrodes 114, and the common connection electrodes 114 are electrically connected to electrode terminals of the power supply unit 2, respectively. That is, the power supply unit 2 supplies power to the light emitting units 10 of the light-source unit 1 directly. Here, each of the light emitting units 10 includes a first electrode 11 and a second electrode 12 which are provided opposite to each other and in different layers and a light emitting layer 14 and an insulating layer 13 which are provided between the first electrode 11 and the second electrode 12. The light emitting layer 14 is provided in a closed region defined by the insulating layer 13. For example, in a case where the first electrode 11 is an anode of an OLED device and the second electrode 12 is a cathode of the OLED device, the common connection electrodes 114 may include a positive common connection electrode provided in a layer in which the first electrode 11 is provided and a negative common connection electrode provided in a layer in which the second electrode 12 is provided, a plurality of the first electrodes 11 are connected to a positive electrode terminal of the power supply unit through the positive common connection electrode, and a plurality of the second electrodes 12 are connected to a negative electrode terminal of the power supply unit through the negative common connection electrode. In the present embodiment, portions of the plurality of first electrodes 11 for connecting the first electrodes 11 in parallel with each other form the positive common connection electrode of the common connection electrodes 114, as shown in FIG. 2A. Similarly, portions of the plurality of second electrodes 12 for connecting the second electrodes 12 in parallel with each other form the negative common connection electrode of the common connection electrodes 114 (not shown). According to the above structure of each of the light emitting units 10, each of the light emitting units 10 may be an OLED device, and the common connection electrodes 114 may be common electrodes of different OLED devices (e.g., the common electrodes may be formed by connecting cathodes or anodes of the different OLED devices). Obviously, the first electrode 11 may be a cathode of an OLED device and the second electrode 12 may be an anode of the OLED device. In this case, the first electrode 11 is connected to the negative electrode terminal of the power supply unit through a negative common connection electrode provided in a layer in which the first electrode 11 is provided, and the second electrode 12 is connected to the positive electrode terminal of the power supply unit through a positive common connection electrode provided in a layer in which the second electrode 12 is provided. The present invention is not limited thereto.

Figure 2B:
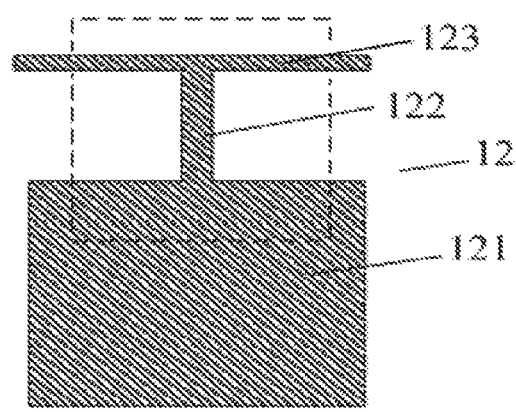
FIG. 2B is a schematic diagram showing a structure of a second electrode in a light emitting unit according to the first embodiment of the present invention.

Specifically, as shown in FIG. 2A, each of the first electrodes 11 includes a first-electrode body 111 and a first-electrode connection portion 112 and a first-electrode connector 113 which are formed by an extension of the first-electrode body 111, and the first-electrode connectors 113 of the light emitting units in a row are electrically connected to each other to form the common connection electrode 114 corresponding to this row. FIG. 2B shows the second electrode 12. Each of the second electrodes 12 includes a second-electrode body 121 and a second-electrode connection portion 122 and a second-electrode connector 123 which are formed by an extension of the second-electrode body 121, the second-electrode body 121, the second-electrode connection portion 122 and the second-electrode connector 123 correspond to the first-electrode body 111, the first-electrode connection portion 112 and the first-electrode connector 113, respectively;

As an example, in FIGS. 2A and 2B, the plurality of light emitting units 10 of the light-source unit 1 in the light source according to the present embodiment are arranged in an array, each of the positive common connection electrode and the negative common connection electrode of the common connection electrodes 114 includes a first common connection electrode and a second common connection electrode, the first common connection electrode being formed by electrically connecting to each other the first-electrode connectors 113 of the light emitting units 10 in a row direction and extending along the row direction, the second common connection electrode crossing and being electrically connected to the first common connection electrode, and extending along a column direction. The second common connection electrode may be perpendicular to the first common connection electrode. Alternatively, the second common connection electrode may not be perpendicular to but obliquely cross the first common connection electrode, as long as they are electrically connected to each other.

Preferably, the first-electrode body 111 and the second-electrode body 121 have a same shape, the first-electrode connection portion 112 and the second-electrode connection portion 122 have a same shape, and the first-electrode connector 113 and the second-electrode connector 123 have a same shape. Further preferably, the second-electrode body 121 has an area smaller than or equal to that of the first-electrode body 111, the second-electrode connection portion 122 has an area smaller than or equal to that of the first-electrode connection portion 112, and the second-electrode connector 123 has an area smaller than or equal to that of the first-electrode connector 113. Here, it should be noted that, it is only a preferable implementation that the first-electrode body 111 and the second-electrode body 121 have both a same shape and a same area, because in this case, a utilization ratio of an area by which the first-electrode body 111 and the second-electrode body 121 are opposite to and overlap with each other can be easily increased to achieve a larger area of the light emitting layer, thereby obtaining a larger amount of emitted light. However, the present invention is not limited thereto, and shapes of the first-electrode body 111 and the second-electrode body 121 and an area by which the first-electrode body 111 and the second-electrode body 121 are opposite to and overlap with each other may be set as desired.

Further preferably, a shape of each of the first-electrode body 111 and the second-electrode body 121 is a square, a circle, or a honeycomb. However, the present invention is not limited thereto, and a shape of each of the first-electrode body 111 and the second-electrode body 121 may be any other shape as desired.

In the present embodiment, the insulating layer 13 is provided in a peripheral region between the first-electrode body 111 and the second-electrode body 121 (it should be noted that, the insulating layer 13 may be further provided between the first-electrode connection portion 112 and the second-electrode connection portion 122 and between the first-electrode connector 113 and the second-electrode connector 123), and the light emitting layer 14 is provided in a closed region defined by the insulating layer 13.

Here, it should be also noted that, the light emitting region in the light source is not limited to a specific shape, and the present embodiment takes a square as an example because a manufacturing method thereof is simpler. In this case, the first-electrode body 111, the light emitting layer 14 and the second-electrode body 121 may have a same shape, or may have different shapes, which may be determined according to the requirements in a practical production process.

Here, the light emitting layer 14 is made of a light emitting material such as 8-Hydroxyquinoline aluminum salt (Alq for short) or Bis(2-methyl-8-quinolinolato-N1, O8)-(1,1'-Biphenyl-4-olato)aluminum (Balq for short), and the insulating layer 13 is made of silicon dioxide ($SiO_2$) or a photoresist. That is, each of the light emitting units 10 in the present embodiment may be an OLED device, the first electrode 11 of each of the light emitting units 10 is an anode of the OLED device, the second electrode 12 of each of the light emitting units 10 is a cathode of the OLED device. The anodes (i.e., the first electrodes 11) of a plurality of OLED devices are connected in parallel to form one of the common connection electrodes 114 (i.e., the positive common connection electrode), and the cathodes (i.e., the second electrodes 12) of the plurality of OLED devices are connected in parallel to form the other of the common connection electrodes 114 (i.e., the negative common connection electrode), the positive common connection electrode and the negative common connection electrode being connected to a positive electrode terminal and a negative electrode terminal of the power supply unit 2, respectively. In each of the light emitting units 10, the portions of the first-electrode body 111, the first-electrode connection portion 112 and the first-electrode connector 113 in the dashed-line frame as shown in FIG. 2A form a "I" shape (in other words, form a shape of "H" after it is rotated by 90 degrees), and the portions of the second-electrode body 121, the second-electrode connection portion 122 and the second-electrode connector 123 in the dashed-line frame as shown in FIG. 2B form a "I" shape.

In the present embodiment, referring to FIGS. 1A and 1B, the power supply unit 2 includes a power conversion section 21 and a power storage section 22, and the power conversion section 21 has a shape adapted to that of the light-source unit 1. Preferably, the power conversion section 21 is a solar panel, the power storage section 22 is a rechargeable battery. Generally, a solar panel includes a plurality of conversion cells, each of which has an anode and a cathode, absorbs sunlight and converts light energy into electric energy. The plurality of conversion cells are connected in series or in parallel to form a component. The rechargeable battery is configured to store the electric energy converted by the power conversion section 21 from the absorbed solar energy, and to supply suitable power to light-source units 1 with different cutting sizes so as to supply power to the light emitting units 10 therein. A solar photovoltaic technology is a technology to convert solar energy into electric energy directly by using a battery component. The solar photovoltaic technology is becoming mature, and is one of the renewable energy technologies for the most sustainable development. Since the power supply unit 2 employed in the present embodiment includes power conversion section 21 and the power storage section 22, it has a power conversion function, a charging function, and a discharging function, thus enabling continuous use of the power supply unit 2.

A position of the rechargeable battery may be set flexibly depending on an application. For example, the rechargeable battery may be provided between the light-source unit 1 and the solar panel, as shown in FIG. 1A. Alternatively, the rechargeable battery may be provided at a side of the light-source unit 1 and the solar panel, as shown in FIG. 1B.

In the present embodiment, the light-source unit 1 and the power supply unit 2 are assembled together by being attached to each other. Thus, solar energy is converted into electric energy by using the solar panel and then stored in the rechargeable battery, and then the OLED device can emit light by using the stored electric energy, thereby achieving illumination effect.

Although a solar photovoltaic technology and an OLED technology have come into existence, a combination thereof has not been found in the prior art till now. The light source according to the present embodiment is a photoelectric complex conceived by combining the solar photovoltaic technology and the OLED technology together, which converts solar energy into electric energy to power an OLED so as to cause the OLED to emit light. In the light source according to the present embodiment, the OLED device can also emit light by directly using the energy stored in the rechargeable battery. Since the solar energy is utilized in light emitting, energy can be saved as much as possible. Further, cuttable composite modules are connected in parallel to each other, so as to form a novel convenient chargeable and rechargeable light emitting module.

The light source according to the present embodiment is conceived by combining the solar photovoltaic technology and the OLED lighting technology together so that a solar device and an OLED device can be integrated to form an integrated renewable compound device, thereby meeting the current requirements for a product to be low carbon, environmentally friendly, and low energy consumption.

Second Embodiment

The present embodiment provides a light source, of which the light-source unit 1 has a better light extraction effect or the power conversion section 21 has a better light guiding effect than that of the light-source unit 1 or the power conversion section 21 of the light source according to the first embodiment, thereby causing the power conversion section 21 to have a higher utilization ratio of solar energy.

Figure 3:
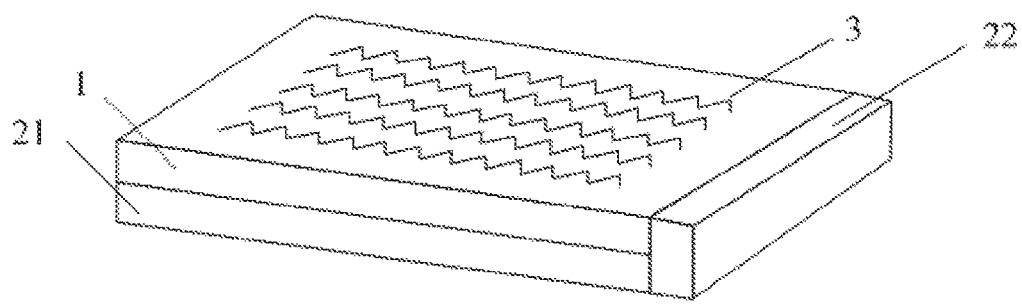
FIG. 3 is a schematic diagram showing a structure of a light source according to a second embodiment of the present invention.

As shown in FIG. 3, a plurality of microstructures 3 are provided at a light emitting side of the light-source unit 1 of the present embodiment, and/or, a plurality of microstructures 3 are provided at a side of the power supply unit 2 which is spaced apart from the light emitting side of the light-source unit 1 (i.e., provided at an outer surface of the power supply unit 2 which is not in direct contact with the light-source unit 1, or provided at a surface of the power supply unit 2 which is not attached to the light-source unit 1 in a case where the light-source unit 1 and the power supply unit 2 are assembled together by being attached to each other as described in the first embodiment). That is, in the present embodiment, only the light emitting side of the light-source unit 1 is provided with a plurality of microstructures 3 (as shown in FIG. 3), or only a side of the power supply unit 2 which is spaced apart from the light emitting side of the light-source unit 1 is provided with a plurality of microstructures 3, or both the light emitting side of the light-source unit 1 and a side of the power supply unit 2 which is spaced apart from the light emitting side of the light-source unit 1 are provided with a plurality of microstructures 3. Here, each of the plurality of microstructures 3 has a size ranging from 0.2 μm to 2000 μm.

The plurality of microstructures 3 provided at the light emitting side of the light-source unit 1 can improve the light extraction effect of light emitted from the light emitting units 10. The plurality of microstructures 3 provided at a side of the power supply unit 2 which is spaced apart from the light emitting side of the light-source unit 1 improve the utilization ratio of solar energy, and reduce energy loss.

Figure 4A:
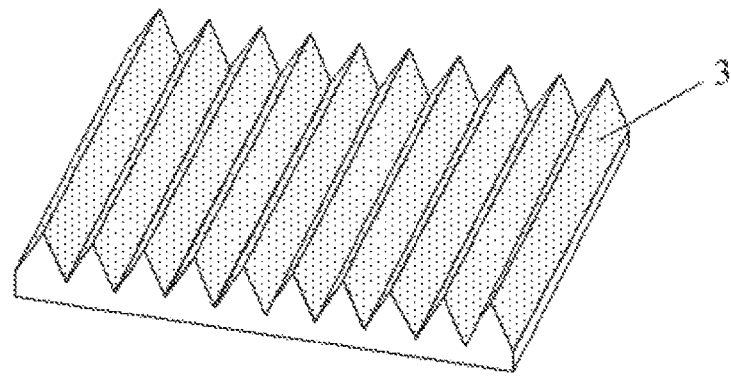
FIGS. 4A to 4D are schematic structural diagrams showing microstructures in the light source of FIG. 3.
Figure 4B:
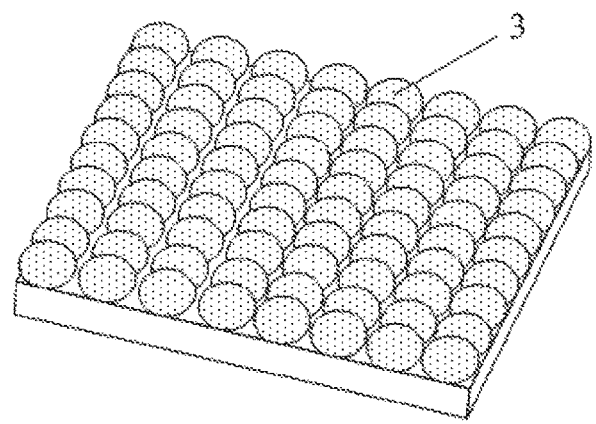
Figure 4C:
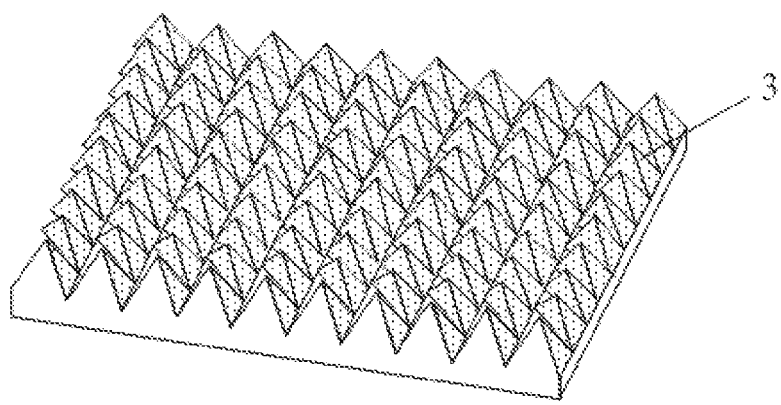
Figure 4D:
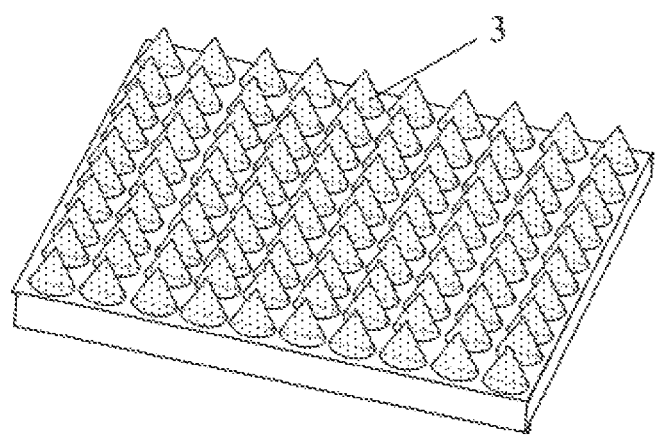

As shown in FIG. 4A, a shape of each of the plurality of microstructures 3 is a triangular strip, and an arrangement of the plurality of microstructures 3 is a triangular-strip array. As shown in FIG. 4B, a shape of each of the plurality of microstructures 3 is a microsphere, and an arrangement of the plurality of microstructures 3 is a microsphere array. As shown in FIG. 4C, a shape of each of the plurality of microstructures 3 is a tetrahedron, and an arrangement of the plurality of microstructures 3 is a tetrahedron array. As shown in FIG. 4D, a shape of each of the plurality of microstructures 3 is a cone, and an arrangement of the plurality of microstructures 3 is a cone array. The plurality of microstructures 3 provided at the light emitting side of the light-source unit or provided at a side of the power supply unit 2 which is spaced apart from the light emitting side of the light-source unit 1 can employ any one of the combinations of the shapes with the corresponding arrangements of the microstructures, but is not limited thereto, and can be variations thereof according to the requirements in a practical production process.

The light source of the present embodiment has a better light extraction effect and a higher utilization ratio of solar energy, and has a better performance.

Third Embodiment

The present embodiment provides a method for manufacturing the light source according to the first embodiment.

The method for manufacturing the light source includes the following steps.

Step S1, forming a light-source unit 1, so that the light-source unit 1 includes the plurality of light emitting units 10 which are connected in parallel.

Specifically, the step of forming the light-source unit 1 includes the following steps.

Figure 5A:
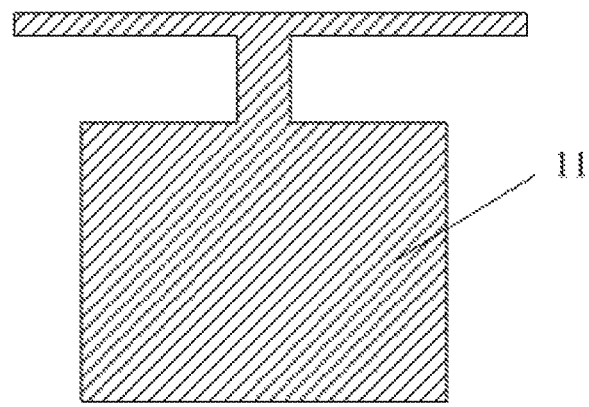
FIGS. 5A to 5D are schematic diagrams showing a method for forming a light-source unit according to a third embodiment of the present invention.

Step S11, forming a pattern including the first electrode 11 on a substrate. As shown in FIG. 5A, the first electrode 11 includes a first-electrode body and a first-electrode connection portion and a first-electrode connector which are formed by an extension of the first-electrode body (see FIG. 2A), and the first-electrode connectors of the plurality of light emitting units are electrically connected to each other to form a common connection electrode (e.g., the positive common connection electrode).

Preferably, the plurality of light emitting units are arranged in an array, the positive common connection electrode includes a first common connection electrode and a second common connection electrode, the first common connection electrode is formed by electrically connecting to each other the first-electrode connectors of the light emitting units in a row direction and extends along the row direction, the second common connection electrode crosses and is electrically connected to the first common connection electrode, and extends along a column direction. Further preferably, the first common connection electrode and the second common connection electrode are perpendicular to each other.

Figure 5B:
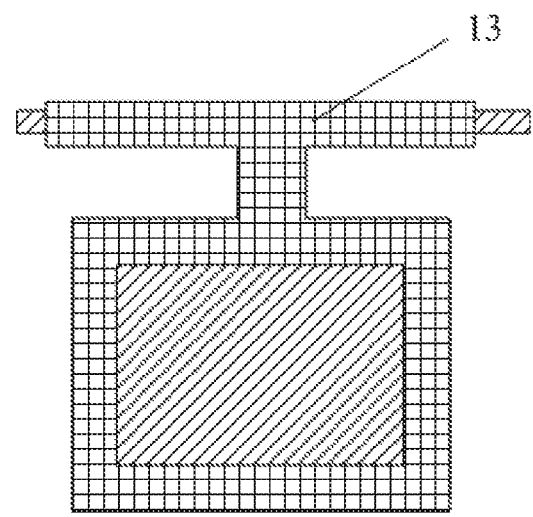

Step S12, forming, on the first electrode 11, a pattern including an insulating layer 13 and a pattern of a light emitting region defined by the pattern of the insulating layer 13. As shown in FIG. 5B, the insulating layer 13 is formed in a peripheral region of the first-electrode body (it should be noted that, the insulating layer 13 may be further provided on the first-electrode connection portion and the first-electrode connector), and may be made of $SiO_2$ or a photoresist.

Figure 5C:
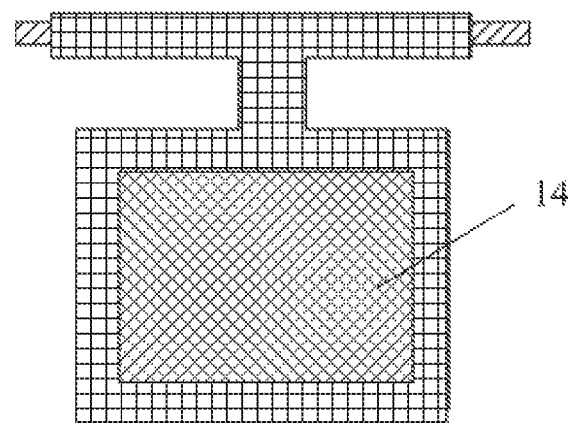

Step S13, forming a light emitting layer 14 in the pattern of the defined light emitting region. As shown in FIG. 5C, the pattern of the light emitting layer 14 is formed in a closed region defined by the insulating layer 13, wherein the light emitting layer 14 may be made of Alq or Balq.

Figure 5D:
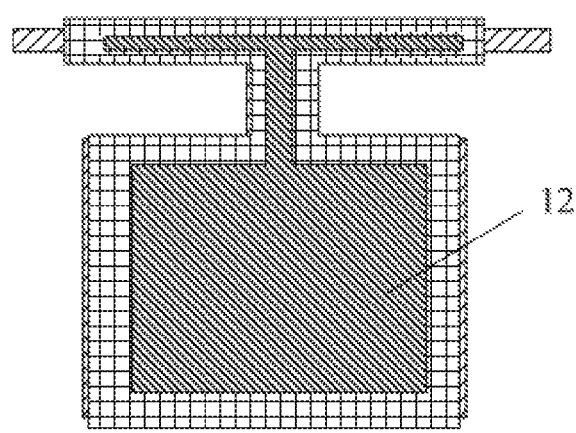

Step S14, forming a pattern including a second electrode 12 on the light emitting layer 14 and the insulating layer 13. As shown in FIG. 5D, the second electrode 12 includes a second-electrode body and a second-electrode connection portion and a second-electrode connector which are formed by an extension of the second-electrode body (see FIG. 2B), the second-electrode body, the second-electrode connection portion and the second-electrode connector correspond to the first-electrode body, the first-electrode connection portion and the first-electrode connector, respectively. The second-electrode connectors of the plurality of light emitting units are electrically connected to each other to form a common connection electrode (e.g., the negative common connection electrode).

Preferably, the plurality of light emitting units are arranged in an array, the negative common connection electrode includes a first common connection electrode and a second common connection electrode, the first common connection electrode is formed by electrically connecting to each other the second-electrode connectors of the light emitting units in a row direction and extends along the row direction, the second common connection electrode crosses and is electrically connected to the first common connection electrode, and extends along a column direction. Further preferably, the first common connection electrode and the second common connection electrode are perpendicular to each other.

In the steps as shown in FIGS. 5A to 5D, description is made by taking steps of forming only one light emitting unit 10 as an example. A plurality of light emitting units 10 may be formed by repeating the steps as shown in FIGS. 5A to 5D.

Step S15, packaging the above structures to form the light-source unit 1.

Step 2, forming a power supply unit 2, so that the power supply unit 2 includes a power conversion section 21 and a power storage section 22.

In the present step, the power supply unit 2 may be purchased from the market or may be a customized power supply unit from a solar-panel manufacturer.

Here, it should be noted that, the sequence of the step S1 of forming a light-source unit 1 and the step S2 of forming a power supply unit 2 is not limited to the above description, and may be changed according to equipment conditions and process conditions in a practical production process.

Step S3, assembling the light-source unit 1 and the power supply unit 2 together by attaching them to each other.

By employing the method for manufacturing a light source according to the present embodiment, the light source according to the first embodiment can be manufactured quickly and easily, and the light source according to the second embodiment can be manufactured by further providing a plurality of microstructures 3 to the light source according to the first embodiment.

Fourth Embodiment

The present embodiment provides a customizable illumination device including the light source according to the first or second embodiment. Here, the light source includes at least one light emitting unit and a power supply unit corresponding to the at least one light emitting unit, and the at least one light emitting unit and the power supply unit are connected to each other through the common connection electrodes.

The present embodiment further provides a manufacturing method of a customizable illumination device. The manufacturing method includes: employing the light source according to the first or second embodiment, and cutting the light source along a same side of the common connection electrodes relative to at least one of the light emitting units, so that all of the light emitting units included in a resultant light-source portion are connected to each other through the common connection electrode to form a predetermined-shape light-source portion of the customizable illumination device.

FIG. 6 shows cutting lines 4 (i.e., the dashed lines as shown) in the light source. Each of the cutting lines 4 is generally located at the same side of the common connection electrodes in the light source. That is, each of the cutting lines 4 is located at a same side (i.e., an upper side or a lower side) of the first common connection electrodes arranged in a row direction and at a same side (i.e., a left side or a right side) of the second common connection electrodes arranged in a column direction, such that in a resultant light source after cutting, each light emitting unit 10 is electrically connected to the power storage section of the power supply unit 2. For example, the light source is cut along a same side of the common connection electrodes relative to plural light emitting units, so as to form a predetermined-shape light-source portion of a customizable illumination device, as shown in FIG. 6. Here, the solar panel includes a plurality of conversion cells, each of which has an anode and a cathode, absorbs sunlight and converts light energy into electric energy. The plurality of conversion cells are connected in series or in parallel to form a component. The integrity of the conversion cells and the component formed by the conversion cells should be maintained as much as possible when a cutting line is designed, so as to achieve a higher efficiency of converting light energy into electric energy. Obviously, if the integrity of one of the conversion cells is damaged, light emitting of the light-source unit will not be affected, but only the efficiency of converting light energy into electric energy will be decreased.

By including the light source according to the first or second embodiment, connecting the light emitting units in parallel, and connecting the common connection electrodes therein to each other as a grid, the customizable illumination device according to the present embodiment makes the light source cuttable with ease while maintaining a normal light-emitting function, thereby facilitating formation of the customizable illumination device of the present embodiment.

It should be understood that, the foregoing embodiments are only exemplary embodiments used for explaining the principle of the present invention, but the present invention is not limited thereto. Various variations and improvements may be made by a person of ordinary skill in the art without departing from the spirit and essence of the present invention, and these variations and improvements also fall within the protection scope of the present invention.

What is claimed is:

1. A light source, comprising a light-source unit comprising a plurality of light emitting units and a power supply unit provided at a non-light emitting side of the light-source unit, wherein, the plurality of light emitting units are connected in parallel and comprise common connection electrodes, and the common connection electrodes are electrically connected to electrode terminals of the power supply unit, respectively;

wherein, each of the light emitting units is an OLED device and comprises a first electrode and a second electrode which are provided opposite to each other and in different layers and a light emitting layer and an insulating layer which are provided between the first electrode and the second electrode, the common connection electrodes comprise a positive common connection electrode provided in a layer in which the first electrode is provided and a negative common connection electrode provided in a layer in which the second electrode is provided, a plurality of the first electrodes are connected to a positive electrode terminal of the power supply unit through the positive common connection electrode, and a plurality of the second electrodes are connected to a negative electrode terminal of the power supply unit through the negative common connection electrode;

wherein, the plurality of the first electrodes are connected in parallel to form the positive common connection electrode, and the plurality of the second electrodes are connected in parallel to form the negative common connection electrode.

2. The light source according to claim 1, wherein, each of the first electrodes comprises a first-electrode body and a first-electrode connection portion and a first-electrode connector which are formed by an extension of the first-electrode body;

each of the second electrodes comprises a second-electrode body and a second-electrode connection portion and a second-electrode connector which are formed by an extension of the second-electrode body, the second-electrode body, the second-electrode connection portion and the second-electrode connector correspond to the first-electrode body, the first-electrode connection portion and the first-electrode connector, respectively; the first-electrode connectors of the plurality of light emitting units are electrically connected to each other to Form the positive common connection electrode, and the second-electrode connectors of the plurality of light emitting units are electrically connected to each other to form the negative common connection electrode; and the insulating layer is provided in a peripheral region between the first-electrode body and the second-electrode body, and the light emitting layer is provided in a closed region defined by the insulating layer.

3. The light source according to claim 2, wherein, the plurality of light emitting units are arranged in an array, each of the positive common connection electrode and the negative common connection electrode comprises a first common connection electrode and a second common connection electrode, the first common connection electrode is formed by electrically connecting to each other the first-electrode connectors of the light emitting units in a row direction and extends along the row direction, the second common connection electrode crosses and is electrically connected to the first common connection electrode, and extends along a column direction, the light emitting units in each column correspond to one second common connection electrode.

4. The light source according to claim 2, wherein, the first-electrode body and the second-electrode body have a same shape, the first-electrode connection portion and the second-electrode connection portion have a same shape, and the first-electrode connector and the second-electrode connector have a same shape.

5. The light source according to claim 2, wherein, a shape of the first-electrode body is a polygon or a circle.

6. A light source, comprising a light-source unit comprising a plurality of light emitting units and a power supply unit provided at a non-light emitting side of the light-source unit, wherein, the plurality of light emitting units are connected in parallel and comprise common connection electrodes, and the common connection electrodes are electrically connected to electrode terminals of the power supply unit, respectively;
wherein, each of the light emitting units is an OLED device and comprises a first electrode and a second electrode which are provided opposite to each other and in different layers and a light emitting layer and an insulating layer which are provided between the first electrode and the second electrode, the common connection electrodes comprise a positive common connection electrode provided in a layer in which the first electrode is provided and a negative common connection electrode provided in a layer in which the second electrode is provided, a plurality or the first electrodes are connected to a positive electrode terminal of the power supply unit through the positive common connection electrode, and a plurality of the second electrodes are connected to a negative electrode terminal of the power supply unit through the negative common connection electrode;
wherein, the light emitting layer is made of Alq or Balq, and the insulating layer is made of silicon dioxide or a photoresist.

7. The light source according to claim 1, wherein, the power supply unit comprises a power conversion section and a power storage section, and the power conversion section has a shape adapted to that of the light-source unit.

8. The light source according to claim 7, wherein, the power conversion section is a solar panel, the power storage section is a rechargeable battery, and the rechargeable battery is provided between the light-source unit and the solar panel or at a side or the light-source unit and the solar panel.

9. The light source according to claim 1, wherein, a plurality of microstructures are provided at a light emitting side of the light-source unit, and/or, a plurality of microstructures are provided at an outer surface of the power supply unit which is not in direct contact with the light-source unit.

10. The light source according to claim 9, wherein, a shape of each of the plurality of microstructures is any one of a triangular strip, a microsphere, a tetrahedron and a cone, and an arrangement of the plurality of microstructures is a corresponding one of a triangular-strip array, a microsphere array, a tetrahedron array and a cone array.

11. The light source according to claim 1, wherein, the light-source unit and the power supply unit are assembled together by being attached to each other.

12. A customizable illumination device, comprising the light source according to claim 1.

13. A manufacturing method of a light source, comprising steps of:
forming a light-source unit, so that the light-source unit comprises a plurality of light emitting units which are connected in parallel;
forming a power supply unit, so that the power supply unit comprises a power conversion section and a power storage section; and
assembling the light-source unit and the power supply unit together by attaching them to each other, and electrically connecting the light-source unit to electrode terminals of the power supply unit through common connection electrodes;
wherein, the step of forming the light-source unit comprises steps of:
forming a pattern comprising a first electrode on a substrate;
forming, on the first electrode, a pattern comprising an insulating layer and a pattern of a light emitting region defined by the pattern of the insulating layer;
forming a light emitting layer in the pattern of the defined light emitting region;
forming a pattern comprising a second electrode on the light emitting layer and the insulating layer; and
packaging the above structures to form the light-source unit.

14. The manufacturing method according to claim 13, wherein, the first electrode comprises a first-electrode body and a first-electrode connection portion and a first-electrode connector which are formed by an extension of the first-electrode body;
the pattern of the insulating layer is formed in a peripheral region of the first-electrode body;
the pattern of the light emitting layer is formed in a closed region defined by the insulating layer;
the second electrode comprises a second-electrode body and a second-electrode connection portion and a second-electrode connector which are formed by an extension of the second-electrode body, the second-electrode body, the second-electrode connection portion and the second-electrode connector correspond to the first-electrode body, the first-electrode connection portion and the first-electrode connector, respectively;
wherein, the common connection electrodes comprise a positive common connection electrode provided in a layer in which the first electrode is provided and a negative common connection electrode provided in a layer in which the second electrode is provided, a plurality of the first electrodes are connected to a positive electrode terminal of the power supply unit through the positive common connection electrode, and a plurality of the second electrodes are connected to a negative electrode terminal of the power supply unit through the negative common connection electrode; and wherein, the first-electrode connectors of the plurality of light emitting units are electrically connected to each other to form the positive common connection electrode, and the second-electrode connectors of the plurality of light emitting units are electrically connected to each other to form the negative common connection electrode.

15. The manufacturing method according to claim 14, wherein, the plurality of light emitting units are arranged in an array, each of the positive common connection electrode and the negative common connection electrode comprises a first common connection electrode and a second common connection electrode, the first common connection electrode is formed by electrically connecting to each other the first-electrode connectors of the light emitting units in a row direction and extends along the row direction, the second common connection electrode crosses and is electrically connected to the first common connection electrode, and extends along a column direction, the light emitting units in each column correspond to one second common connection electrode.

16. A manufacturing method of a customizable illumination device, comprising: employing the light source according to claim 1, and cutting the light source along a same side of the common connection electrodes relative to at least one of the light emitting units, so that all of the light emitting units included in a resultant light-source portion are connected to each other through the common connection electrode to form a predetermined-shape light-source portion of the customizable illumination device.

* * * * *